United States Patent [19]

Batra et al.

[11] 4,450,021

[45] May 22, 1984

[54] MASK DIFFUSION PROCESS FOR FORMING ZENER DIODE OR COMPLEMENTARY FIELD EFFECT TRANSISTORS

[75] Inventors: Tarsaim L. Batra, Cupertino; Scott Bowden, San Jose, both of Calif.

[73] Assignee: American Microsystems, Incorporated, Santa Clara, Calif.

[21] Appl. No.: 351,075

[22] Filed: Feb. 22, 1982

[51] Int. Cl.$^3$ .................... H01L 21/22; H01L 21/265
[52] U.S. Cl. .................................. 29/571; 29/576 B; 29/578; 148/187
[58] Field of Search .................... 148/187, 1.5; 29/571, 29/576 B, 578

[56] References Cited

U.S. PATENT DOCUMENTS

| | | |
|---|---|---|
| 3,677,838 | 7/1972 | DeBrisson .......................... 148/187 |
| 3,928,081 | 12/1975 | Marley et al. ...................... 148/1.5 |
| 4,099,998 | 7/1978 | Ferro et al. ........................ 148/187 |
| 4,277,291 | 7/1981 | Cerofolini et al. ............. 148/187 X |
| 4,295,897 | 10/1981 | Tubbs et al. ..................... 148/187 X |
| 4,306,916 | 12/1981 | Wollesen et al. ................. 29/571 X |
| 4,381,956 | 5/1983 | Lane ................................ 148/187 X |
| 4,382,827 | 5/1983 | Romano-Moran et al. ...... 29/571 X |

OTHER PUBLICATIONS

D. P. Kennedy and R. B. O'Brien, "Avalanche Breakdown Characteristics of a Diffused P-N Junction", *IRE Transactions on Electron Devices*, Nov. 1962, pp. 478-483.
R. C. Dobkin, "Monolithic Temperature Stabilized Voltage Reference with 0.5 ppm/° Drift", 1976 *IEEE International Solid-State Circuits Conference*, Feb. 19, 1976, pp. 108-109.
Sik Lui, Robert G. Meyer, and Norman Kwan, "An Ion-Implanted Subsurface Monolithic Zener Diode", *IEEE Journal of Solid-State Circuits*, vol. SC-14, No. 4, Aug. 1979, pp. 782-784.
William F. Davis, "A Five-Terminal ±15-V Monolithic Voltage Regulator", *IEEE Journal of Solid-State Circuits*, vol. SC-6, No. 6, Dec. 1971, pp. 366-376.
B. W. Ricketts, "Impedance of Zener Diodes at Low Frequencies", *Int. J. Electronics*, 1981, vol. 51, No. 2, pp. 181-184.
Ranjeet K. Pancholy and Takamasa John Oki, "C--MOS/SOS Gate-Protection Networks", *IRE Transactions on Electron Devices*, vol. ED-25, No. 8, Aug. 1978, pp. 917-925.
Donald T. Comer, "A Monolithic 12-Bit DAC", *IEEE Transactions on Circuits and Systems*, vol. CAS-25, No. 7, Jul. 1978, pp. 504-509.
R. S. Sharma & M. A. Peer, "On the Mechanism of Reverse Voltage Breakdown in Zener Diodes & Transistors", *Indian J. Pure Appl. Phys.*, vol. 16, Jan. 1978, pp. 61 and 62.
R. S. Sharma & M. A. Peer, "Effect of Temperature on Avalanche Multiplication in Zener Diodes", *Indian J. Pure Appl. Phys.*, vol. 16, Jul. 1978, pp. 724-726.
R. S. Sharma & M. A. Peer, "Temperature Effects on Junction Breakdown Voltage", *IE(1) Journal-ET*, UDC 621 38-2, vol. 58, Apr. 1978, pp. 82-86.
Jerzy Klamka and Jan Redlich, "Nowa technika wytwarzania wysokonapieciowych diod Zenera", *Elektronika 5 (XX)* 79, pp. 196-199.
N. D. Stojadinovic, Lj. Dj. Ristic and B. V. Vidanovic, "New Technique for Fabrication of Low Voltage Si Zener Diodes", *Electronics Letters*, Feb. 5, 1981, vol. 17, No. 3, pp. 130-132.

*Primary Examiner*—G. Osaki
*Attorney, Agent, or Firm*—Alan H. MacPherson; Steven F. Caserza; Richard Franklin

[57] ABSTRACT

A unique fabrication method allows the formation of regions of opposite conductivity types in a semiconductor substrate 100 utilizing a single masking step. A first mask is formed on the surface of the semiconductor substrate and patterned to define the regions (110) which are to be doped to a first conductivity type. Subsequent to the doping of these first regions, a protective layer (111) is formed over these first regions. The mask is then removed, thus exposing the regions (112) which are to be doped to the second conductivity type opposite to said first conductivity type. These exposed regions are then doped to said opposite conductivity type, with the first regions which have been doped to said first conductivity type protected by said protective layer.

5 Claims, 7 Drawing Figures

MASK DIFFUSION PROCESS FOR FORMING ZENER DIODE OR COMPLEMENTARY FIELD EFFECT TRANSISTORS

BACKGROUND OF THE INVENTION

1. Field of the Invention

This invention relates to a method for fabricating CMOS semiconductor devices and, more specifically, to a method for forming regions of opposite conductivities utilizing a single masking step, thereby resulting in fewer process steps, with a resultant decrease in device cost.

2. Description of the Prior Art

One example of a prior art process utilized to fabricate semiconductor regions of opposite conductivity types is given in U.S. Pat. No. 3,928,081 issued to Marley, et al. In the prior art fabrication of semiconductor devices requiring the formation of regions of opposite conductivity types, typically a first mask is utilized to define the regions which are to be doped to a first conductivity type and a second mask is utilized to define the regions which are to be doped to a second conductivity type opposite the first conductivity type. Thus, such prior art fabrication methods require the use of at least two masking steps in order to define and thus form regions of opposite conductivity types.

SUMMARY

In accordance with this invention, a fabrication method is provided which allows the formation of regions of opposite conductivity types utilizing a single masking step. A first mask is formed on the surface of the semiconductor substrate and patterned to define the regions which are to be doped to a first conductivity type. Subsequent to the doping of these first regions, a protective layer is formed over these first regions. Of importance, because the remainder of the surface of the substrate is protected by the mask, these protective layers are not grown on any regions other than those regions which have been doped to said first conductivity type. Thereafter, the mask is removed, thus exposing the regions which are to be doped to the second conductivity type opposite to said first conductivity type. These exposed regions are then doped to said opposite conductivity type, with the first regions which have been doped to said first conductivity type protected by said protective layer. After the doping of said second regions to a conductivity type opposite said first conductivity type, additional protective layers may be formed over the second doped regions, if desired. This process results in a semiconductor device having regions of differing conductivities formed utilizing but a single masking step. The use of a single masking step results in reduced process steps, and thus reduced device cost. This technique is useful in forming complementary metal oxide silicon (CMOS) devices and self aligned PN diodes, including zener diodes.

DETAILED DESCRIPTION

Figure 1:
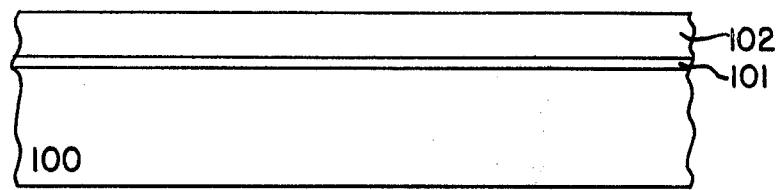
FIGS. 1 through 7 depict cross-sectional views of a CMOS device fabricated in accordance with this invention.

The initial steps of fabricating a Complementary Metal Oxide Silicon (CMOS) device in accordance with this invention correspond to similar steps utilized in prior art CMOS devices. As shown in FIG. 1, a semiconductor substrate 100, such as an N type silicon wafer having conductivity of approximately 3 to 5 ohm-cm, is used as the starting material. Base oxide 101 is grown to a thickness of approximately 500 Å by thermal oxidation, such as oxidation in oxygen for approximately 35 minutes at approximately 1000° C. On the surface of the base oxide 101 is deposited silicon nitride layer 102 to a thickness of approximately 1500 Å. Silicon nitride layer 102 is deposited in a manner well known in the semiconductor arts, such as by a low pressure chemical vapor deposition such as is described by Roessler in *Solid State Technology*, April 1977, page 63 and by Brown et al. in *Solid State Technology*, July 1979, page 51.

Figure 2:
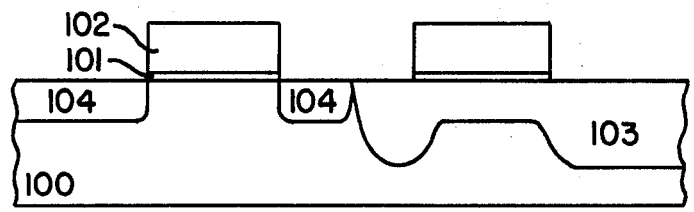

As shown in FIG. 2, base oxide layer 101 and silicon nitride layer 102 are patterned utilizing well-known photolithographic and etching techniques in order to pattern oxide layer 101 and silicon nitride layer 102 to expose the surface of substrate 100 where field oxide is to be subsequently formed. Silicon nitride layer 102 is patterned, for example, by etching with $CF_4$ plasma. Similarly, oxide layer 101 is patterned by etching with, for example, buffered hydrofluoric acid.

Once oxide layer 101 and nitride layer 102 have been patterned, thus exposing the surface of substrate 100 where field oxide is to be formed, a first layer of masking material (not shown) is applied to the surface of the wafer and patterned in a well-known manner to expose the to-be-formed P well region 103. The P well region 103 then is formed, for example, by a two step implantation of boron ions consisting of a first implant of boron atoms at an energy level of approximately 25 KeV followed by a second implant of boron ions at approximately 90 KeV, thus (after dopant drive, as described more fully later) forming a P well region having a dopant concentration of boron atoms of approximately $3 \times 10^{16}$ atoms/cm$^3$. The use of a two step P-well implant is described in U.S. Pat. No. 4,306,916, issued Dec. 22, 1981, and assigned to American Microsystems, Inc., which is hereby incorporated by reference. This doping procedure also serves to establish the desired P-well field inversion threshold voltage in a well known manner. The first layer of masking material is then removed from the surface of the wafer.

A second layer of masking material (not shown) is applied to the surface of the wafer and patterned to expose those regions of the wafer where there is to be no P-well. An N type dopant, for example arsenic, is then deposited in these regions as indicated by regions 104 in FIG. 2. N type regions 104 form guard rings to provide isolation between N channel devices formed within P well 103, and P channel devices formed within substrate 100. These N type dopants also serve to establish the desired substrate field inversion voltage in a well known manner. The predeposition of this N type dopant is performed, for example, by an implantation of arsenic ions at an energy level of approximately 40 KeV, thus resulting in a dopant concentration of approximately $1.53 \times 10^{12}$ atoms/cm$^2$ within regions 104.

Figure 3:
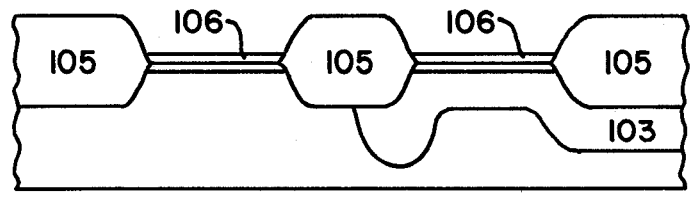

As shown in FIG. 3, field oxide 105 is then thermally grown to a thickness of approximately 1-2 microns. This field oxide is grown, for example, by oxidation in steam for 14 hours at approximately 1000° C., during which time the P type dopants deposited in the P-well and the N type dopants deposited in the substrate are diffused, thus establishing the desired dopant profile (the dopant concentration with respect to distance from the device surface) within the P-well and the substrate. During this field oxide growth, portions of the wafer where it is not desired to form field oxide are protected from oxidation by oxide layer 101 and nitride layer 102 (FIG. 2). Subsequent to the formation of field oxide 105, silicon nitride layer 102 is removed, for example, by etching with a $CF_4$ plasma. Oxide region 101 is then removed, for example, by etching in buffered hydrofluoric acid. During the removal of oxide region 101, a small decrease in the thickness of field oxide 105 occurs. However, because field oxide 105 is extremely thick relative to the thickness of oxide layer 101, this slight decrease in the thickness of field oxide 105 is unimportant, and may be ignored.

Gate oxide 106 (FIG. 3) is then formed to a thickness of approximately 500–1000 Å by thermal oxidation in steam for approximately 15 minutes at approximately 1000° C., for example. During the formation of gate oxide 106, the thickness of field oxide regions 105 is increased slightly, although this slight increase in the thickness of field oxide 105 may be ignored.

A layer of polycrystalline silicon 107 is deposited on the surface of the wafer. Polycrystalline silicon 107 is then doped to reduce its sheet resistance to approximately 30 ohms/square, for example by doping with phosphorus by applying to the wafer $POCl_3$ for 12 minutes at approximately 970° C. Polycrystalline silicon layer 107 is formed to a thickness of approximately 4,000 Å. by, for example, low pressure chemical deposition, as described by Saraswat et al. in *Journal of the Electrochemical Society*, Number 125, page 927 (1978).

Figure 4:
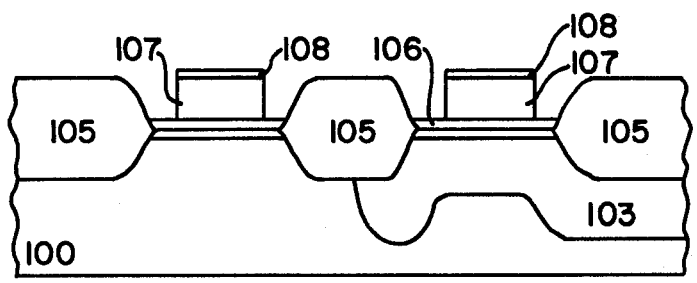

Polycrystalline silicon region 107 is then oxidized, thus forming an oxide layer 108 of approximately 1,000 Å thickness. Polycrystalline silicon 107 is oxidized, for example, by wet oxidation (oxidation in steam) for approximately 7 minutes at approximately 950° C. Polycrystalline silicon 107 and oxide 108 are then patterned into gate regions overlying gate oxide 106, as shown in FIG. 4. Oxide layer 108 and polycrystalline silicon are patterned utilizing well-known masking techniques, for example, by etching oxide 108 with buffered HF and etching polycrystalline silicon 107 with, for example, $CF_4$ plasma. Thus polycrystalline gates 107 and oxide 108 are formed as shown in FIG. 4.

Figure 5:
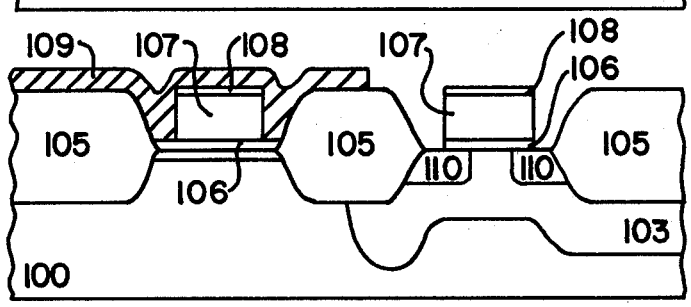

Prior to removing the photoresist defining the gate regions 107, the gate oxide 106 surrounding gate regions 107 is removed, for example by etching with buffered HF. A thin (approximately 130 Å) layer of oxide (not shown) is then formed over the entire surface of the water to prevent damage to the silicon underlying the to-be-formed nitride layer 109. This oxide is formed, for example, by oxidation in dry oxygen for 10 minutes at approximately 950° C. A layer of silicon nitride 109 (FIG. 5) is then deposited on the surface of the wafer and patterned to expose that portion of the wafer in which regions of a first conductivity type are to be formed. Silicon nitride layer 109 is formed to a thickness of approximately 700 Å. by, for example, low-pressure chemical vapor deposition, such as described in the aforementioned articles by Roessler and Brown. Silicon nitride layer 109 is then patterned as shown in FIG. 5 to expose the surface of the wafer containing P well 103. Silicon nitride layer 109 may be patterned by utilizing well-known photolithographic masking techniques and etching undesired portions of silicon nitride 109 with, for example, $CF_4$ plasma. Source and drain regions are then formed within P well 103 by doping regions 110 with an N type dopant, such as phosphorous. Regions 110 of N type conductivity are formed, for example, by gaseous deposition of $POCl_3$ for 3 minutes at approximately 970° C. or, alternatively, by the ion implantation of phosphorous or arsenic atoms.

Figure 6:
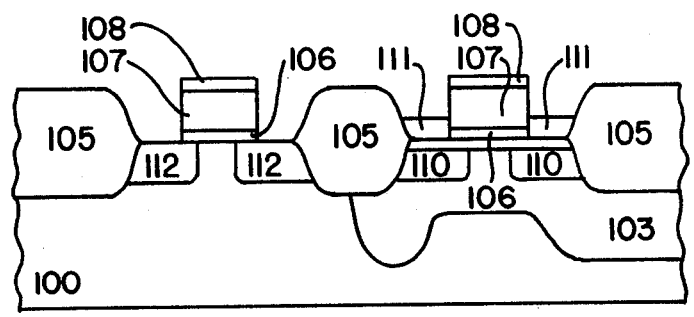

The next step is of critical importance in the practice of this invention. As shown in FIG. 6, a thin layer of oxide 111 (approximately 1200 Å) is formed over source/drain regions 110. Oxide regions 111 are formed, for example, by thermal oxidation in steam for approximately 3 minutes at approximately 1050° C. During this oxidation, the exposed oxide regions 108 and the exposed field oxide regions 105 (exposed being those regions not covered by silicon nitride layer 109 shown in FIG. 5) are also oxidized, thus increasing their thickness slightly. This slight increase in the thickness of exposed oxide regions 105 and 108 is unimportant and may be ignored. Of importance, the formation of oxide region 111 serves to protect regions 110 from subsequent doping, thus eliminating the need for a second mask to be formed over the surface of the wafer and patterned to expose to-be-formed P regions 112, while protecting N regions 110.

With oxide regions 111 formed, silicon nitride layer 109 (FIG. 5) is removed, for example, by etching with $CF_4$ plasma. The very thin layer of oxide formed on the silicon nitride 109 during the formation of oxide regions 111 is also removed by the $CF_4$ plasma. Those portions of thin oxide covering the to-be-formed P type conductivity regions 112 are then removed, for example, by etching in buffered hydrofluoric acid. Of importance, during this removal of portions of gate oxide 106, field oxide regions 105, oxide regions 108, and protective oxide regions 111 are also etched. However, because each oxide region 105, 108 and 111 is significantly thicker than thin oxide layer 106, thin oxide 106 is completely removed while leaving intact, although slightly thinner, field oxide 105, oxide 108, and protective oxide 111.

Regions 112 of P type conductivity may now be formed in substrate 100 as shown in FIG. 6. P type regions are formed, for example, by doping with boron, from a gaseous $BBr_3$ source for 8 minutes at approximately 1075° C. or by low energy (e.g. 30–70 keV) ion implantation of boron atoms. Of critical importance, the boron source is applied on the surface of the entire wafer. However, boron enters only in regions 112, because all other portions of the wafer are protected from boron deposition either by field oxide regions 105, the gate structure comprised of gate oxide 106, polycrystalline gate 107, and oxide 108, or by protective oxide 111 formed above N type regions 110.

Thus, N type regions 110 and P type regions 112 are formed in a semiconductor substrate utilizing a single photolithographic masking step. The formation of such N type regions and P type regions in a wafer was heretofore generally possible only by the use of two separate masking steps, requiring an increased number of process steps, as well as a resultant increase in cost. Prior art one-mask introduction of N type and P type dopants utilizing phosphorus doped oxide cannot be easily used to fabricate semiconductor devices of small (less than 5 micron line width) devices.

Figure 7:
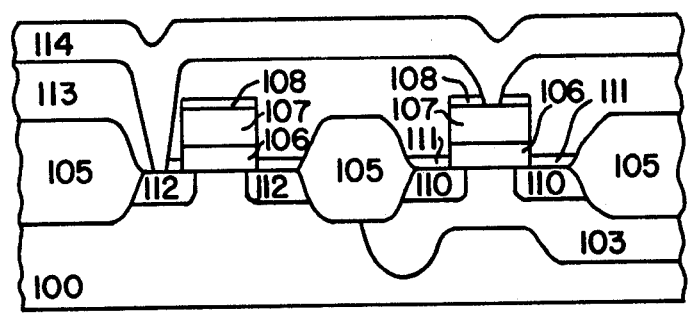

As shown in FIG. 7, the remaining process steps in the fabrication of a device according to this invention are similar to those used in the fabrication of prior art devices. Specifically, a layer of isolation oxide 113 is formed to a thickness of approximately 10,000 Å over the entire surface of the wafer for example, by chemical vapor deposition. Contact openings are then formed, as shown in FIG. 7, through isolation oxide 113, thus allowing electrical contact to be made to source region 112a of FIG. 7. In a similar manner, a contact opening is made in isolation oxide 113 and protective oxide 108, thus allowing contact to be made to polycrystalline silicon gate region 107. The formation of contact openings through isolation oxide 113 and various other oxides within the structure is performed in a conventional manner, utilizing suitable prior art photolithographic masking techniques and etching the exposed oxide layers with, for example, buffered hydrofluoric acid. With contact openings made, a layer of metallization 114 is formed on the surface of the wafer. Metallization 114 is preferably aluminum formed in a conventional manner. The metallization layer 114 is then patterned, such as by utilizing well-known photolithographic techniques, and etching undesired portions of metallization 114 with, for example, an etching solution comprised of acetic, nitric and phosphoric acids.

In an alternative embodiment of this invention, a substrate is masked in a well known manner (e.g. by photoresist) to expose a first region. A dopant of a first conductivity type is introduced into the first region exposed by the mask. A protective layer (e.g. silicon dioxide or silicon nitride) is formed on the first region in a well known manner and the mask is removed. A dopant of a second conductivity type opposite said first conductivity type is introduced into the region previously protected by the mask and now exposed by the protective layer. In this manner, self-aligned regions (i.e. perfectly aligned regions formed utilizing a single mask) of opposite conductivity types are fabricated, thereby forming a self-aligned PN junction.

In yet another embodiment of this invention, a substrate is masked in a well known manner (e.g. by photoresist) to expose a first region. A dopant of a first conductivity type is introduced into the first region exposed by the mask. A protective layer (e.g. silicon dioxide or silicon nitride) is formed on the first region in a well known manner and the mask is removed. A dopant of said first conductivity type but to a different dosage is introduced into the region previously protected by the mask and now exposed by the protective layer. In this manner, self-aligned regions (i.e. perfectly aligned regions formed utilizing a single mask) of the same conductivity types but different dopant profiles are fabricated.

While specific embodiments have been disclosed in this specification, these embodiments are merely illustrative of our invention and are not to be construed as limitations of our invention. Other embodiments of our invention will become apparent to those skilled in the art in light of the teachings of our invention.

We claim:

1. The method of forming a complementary metal oxide-silicon device within a substrate of first conductivity type comprising the steps of:
    forming within said substrate a well region of a second conductivity type which is opposite said first conductivity type;
    forming a field region in all areas where active devices are not to be formed, thus exposing active regions on the surface of said substrate in which active devices are to be formed;
    forming a gate dielectric layer within said active regions;
    forming a gate region on said gate dielectric layer;
    masking said substrate with a first protective layer;
    patterning said first protective layer and said gate insulation layer to expose only those active regions on the surface of said well region;
    doping source and drain regions to said first conductivity type within said well region which are not protected by said gate regions or said field regions;
    forming a second protective layer on the surface of said substrate not protected by said first protective layer, said field region or said gate region;
    removing said first protective layer; and
    doping source and drain regions to a second conductivity type within said substrate which are not protected by said second protective layer, said field region or said gate region.

2. The method of forming a PN junction within a substrate and near the surface of said substrate comprising the steps of:
    forming a mask on the surface of said substrate to expose a first region of said substrate where it is desired to introduce a dopant of a first conductivity type;
    introducing dopant of said first conductivity type into said substrate, wherein said dopant of said first conductivity type is formed within said first region;
    forming a protective layer on the surface of said first region;
    removing said mask from said substrate; and
    introducing dopant of a second conductivity type into said substrate, wherein said dopant of said second conductivity type is formed within a second region of said substrate which had not been exposed by said mask, said second region lying adjacent to said first region.

3. The method of claim 2 wherein said first conductivity type is N and said second conductivity type is P.

4. The method of claim 2 wherein said first conductivity type is P and said second conductivity type is N.

5. The method of claim 2 wherein said PN junction comprises a zener diode.

* * * * *